US010622089B2

(12) United States Patent
Hashimoto

(10) Patent No.: US 10,622,089 B2
(45) Date of Patent: Apr. 14, 2020

(54) STORAGE SYSTEM HAVING A HOST THAT MANAGES PHYSICAL DATA LOCATIONS OF STORAGE DEVICE

(71) Applicant: TOSHIBA MEMORY CORPORATION, Tokyo (JP)

(72) Inventor: Daisuke Hashimoto, Susono (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 439 days.

(21) Appl. No.: 15/296,812

(22) Filed: Oct. 18, 2016

(65) Prior Publication Data

US 2018/0107391 A1 Apr. 19, 2018

(51) Int. Cl.
| G06F 3/06 | (2006.01) |
| G11C 16/10 | (2006.01) |
| G11C 16/26 | (2006.01) |
| G11C 16/16 | (2006.01) |
| G06F 11/10 | (2006.01) |
| G11C 29/52 | (2006.01) |
| G06F 12/06 | (2006.01) |
| G11C 11/56 | (2006.01) |
| G11C 29/42 | (2006.01) |
| G06F 12/02 | (2006.01) |
| G11C 29/44 | (2006.01) |
| G11C 16/04 | (2006.01) |

(Continued)

(52) U.S. Cl.
CPC ............ *G11C 29/52* (2013.01); *G06F 3/0617* (2013.01); *G06F 3/0659* (2013.01); *G06F 3/0679* (2013.01); *G06F 11/1068* (2013.01); *G06F 12/0246* (2013.01); *G11C 11/5628* (2013.01); *G11C 11/5635* (2013.01); *G11C 11/5642* (2013.01); *G11C 16/10* (2013.01); *G11C 16/16* (2013.01); *G11C 16/26* (2013.01); *G11C 29/42* (2013.01); *G06F 2212/1041* (2013.01); *G06F 2212/214* (2013.01); *G06F 2212/222* (2013.01); *G06F 2212/403* (2013.01); *G06F 2212/7201* (2013.01); *G06F 2212/7203* (2013.01); *G11C 16/0483* (2013.01); *G11C 29/028* (2013.01); *G11C 29/82* (2013.01); *G11C 2029/4402* (2013.01)

(58) Field of Classification Search
None
See application file for complete search history.

(56) References Cited

U.S. PATENT DOCUMENTS

| 8,189,391 B2 | 5/2012 | Itagaki et al. |
| 9,607,703 B2 * | 3/2017 | Kanno ................ G11C 11/5642 |
| 2010/0207195 A1 | 8/2010 | Fukuzumi et al. |

(Continued)

*Primary Examiner* — Justin R Knapp
(74) *Attorney, Agent, or Firm* — Kim & Stewart LLP

(57) ABSTRACT

A storage device includes a nonvolatile memory, a communication interface connectable to a host, and a controller. The controller is configured to carry out writing of data that is received through the communication interface at a physical location of the nonvolatile memory when a write command associated with the data is received through the communication interface, control the communication interface to return a first notification upon determining that the writing of data at the physical location of the nonvolatile memory has completed, and control the communication interface to return a second notification a predetermined period of time after the first notification has been returned.

18 Claims, 11 Drawing Sheets

(51) Int. Cl.
   *G11C 29/00*      (2006.01)
   *G11C 29/02*      (2006.01)

(56) References Cited

U.S. PATENT DOCUMENTS

| | | | |
|---|---|---|---|
| 2010/0254191 A1 | 10/2010 | Son et al. | |
| 2011/0185268 A1* | 7/2011 | Matsushige | G06F 11/0727 |
| | | | 714/819 |
| 2012/0272120 A1* | 10/2012 | Chen | G11C 11/5628 |
| | | | 714/758 |
| 2013/0031431 A1* | 1/2013 | Sharon | G06F 11/1072 |
| | | | 714/719 |
| 2014/0219034 A1* | 8/2014 | Gomez | G11C 16/06 |
| | | | 365/185.22 |
| 2015/0178189 A1* | 6/2015 | Lasser | G06F 12/0246 |
| | | | 714/6.11 |
| 2018/0059976 A1* | 3/2018 | Helmick | G06F 3/0625 |

* cited by examiner

STORAGE SYSTEM HAVING A HOST THAT MANAGES PHYSICAL DATA LOCATIONS OF STORAGE DEVICE

FIELD

The present disclosure generally relates to a storage system including a host and a storage device, in particular, a storage system that manages location of write data based on physical addresses.

BACKGROUND

A storage system typically includes a host and one or more storage devices each of which may include one or more nonvolatile memory chips, such as NAND flash memory chips. In order to determine a physical location at which the data are stored using an identifier for the data or a logical address of the data, mapping data is stored in each of the storage devices or in the host, and the physical location of the data is determined by referring to the mapping data. Specifically, in a storage system of one type, such mapping data are stored in each of the storage devices, and the location of data communicated between the host and the storage devices is designated by a logical address. In a storage system of another type, the mapping data are stored in the host, and the location of data communicated between the host and the storage devices is the physical location of the data, e.g., designated by physical address of nonvolatile memory chips.

When data are written in a storage device that includes nonvolatile memory chips, it usually takes a certain amount of time until the storage device becomes ready for reading the data. This is because it takes a certain amount of time until electric charges are stably held in memory cells of the nonvolatile memory chip. For that reason, when the host issues a read command to read the data immediately after the data are written, the data may not be properly read from the nonvolatile memory chip. Such an issue is particularly significant when the location of data communicated between the host and the storage device is a physical location, because the storage device will need to read data from the same physical location. On the other hand, when the location of data communicated between the host and the storage device is an identifier for the data or a logical address, the storage device may be able to read the requested data from a location different from the physical location corresponding to the identifier or the logical address, e.g., a buffer configured in volatile memory in which the incoming write data are initially stored.

DETAILED DESCRIPTION

According to an embodiment, a storage device includes a nonvolatile memory, a communication interface connectable to a host, and a controller. The controller is configured to carry out writing of data that is received through the communication interface at a physical location of the nonvolatile memory when a write command associated with the data is received through the communication interface, control the communication interface to return a first notification upon determining that the writing of data at the physical location of the nonvolatile memory has completed, and control the communication interface to return a second notification a predetermined period of time after the first notification has been returned.

According to another embodiment, a storage system includes a storage device including a nonvolatile memory, a communication interface, and a controller, and a host connected to the communication interface of the storage device, and including a write buffer memory and a processor. The controller is configured to carry out writing of data that is received through the communication interface from the host at a physical location of the nonvolatile memory when a write command associated with the data is received through the communication interface from the host, control the communication interface to return a first notification to the host upon determining that the writing of data at the physical location of the nonvolatile memory has completed, and control the communication interface to return a second notification to the host a predetermined period of time after the first notification has been returned.

According to still another embodiment, a computing device connectable to a nonvolatile storage device includes a memory unit, a controller communicable with the nonvolatile storage device through a communication interface of the nonvolatile storage device, and a processor. The processor is configured to temporarily store data in the memory unit, control the controller to transmit a write command associated with the data to the nonvolatile storage device, store, in the memory unit, a mapping between an identifier or a logical address for the data and a physical location of the nonvolatile memory at which the data were written, when a first notification indicating completion of writing the data is returned from the nonvolatile storage device, and erase or trim the data stored in the memory unit when a second notification indicating that the data stored at the physical location of the nonvolatile memory are ready to be read is returned from the storage device after the first notification.

Details of the present disclosure are described below with reference to the drawings.

[Storage System]

Figure 1:
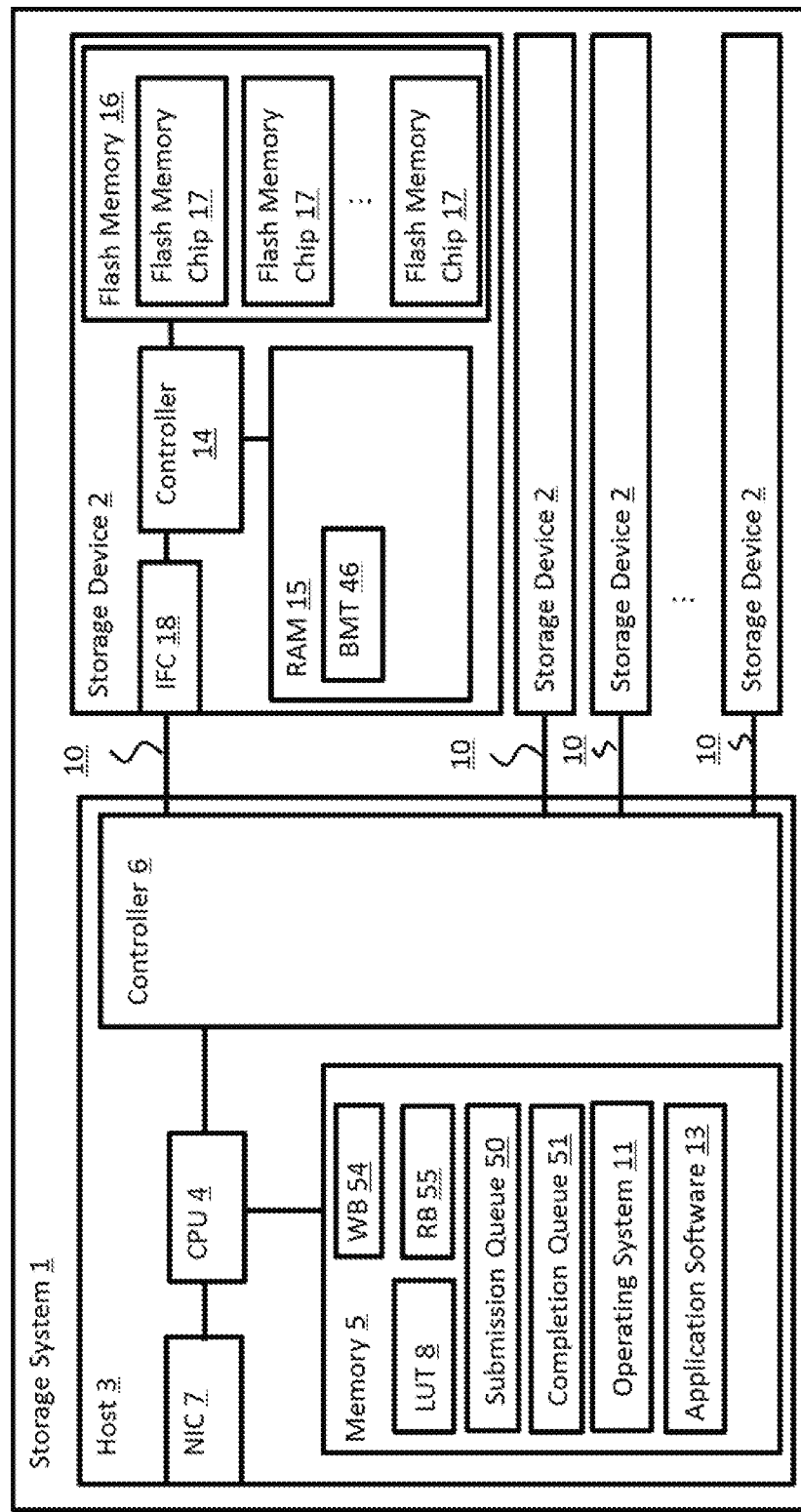
FIG. 1 illustrates a configuration of a storage system, which includes a host and at least a storage device, according to an embodiment.
Figure 2:
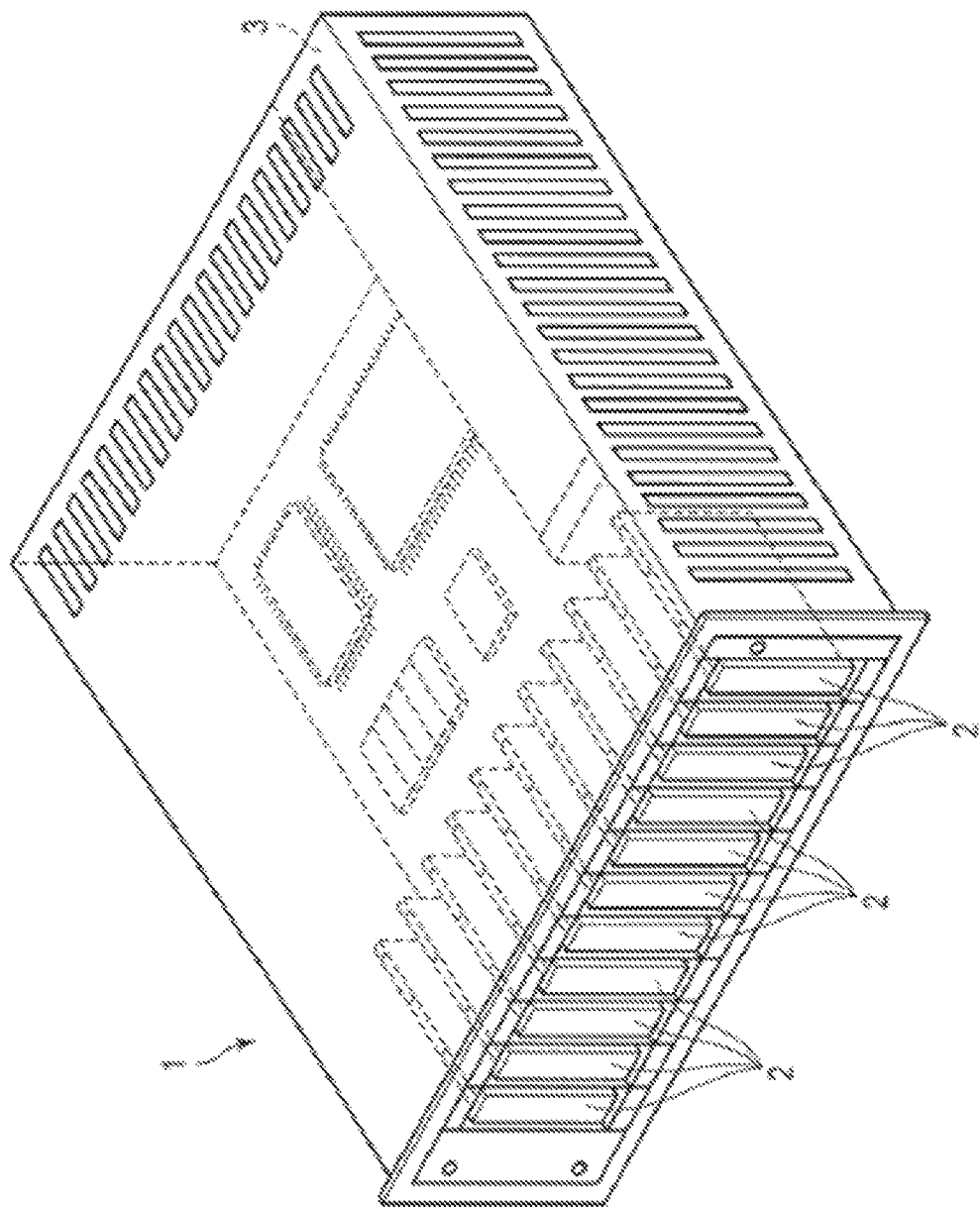
FIG. 2 illustrates a physical configuration of the storage system according to the embodiment.

FIG. 1 illustrates a configuration of a storage system 1 according to an embodiment. The storage system 1 includes a host 3, one or more storage devices 2, and an interface 10 configured to connect the host 3 and each of the storage devices 2. In the present embodiment, the storage system 1 is a 2U storage appliance shown in FIG. 2. That is, the host 3 and the one or more storage devices 2 are enclosed in a housing having a size of the 2U storage appliance. Each of the storage devices 2 is a nonvolatile storage device such as a 2.5 inch form factor, 3.5 inch form factor, M.2 form factor, or an Add-In Card (AIC) form factor. Further, in the present embodiment, the interface 10 employs PCI Express (Peripheral Component Interconnect Express, PCIe) interface. Alternatively, the interface 10 can employ any other technically feasible protocol, such as SAS (Serial Attached SCSI) protocol, USB (Universal Serial Bus), SATA (Serial Advanced Technology Attachment), Thunderbolt®, Ethernet®, Fibre channel, and the like.

The storage device 2 includes a controller 14, a random access memory (RAM) 15, a non-volatile semiconductor memory, such as a NAND flash memory 16 (hereinafter flash memory 16), and an interface controller (IFC) 18. The IFC 18 is configured to perform transmission and reception of signals to and from the host 3 via the interface 10. The controller 14 is configured to manage and control the flash memory 16, the RAM 15, and the IFC 18.

The RAM 15 is, for example, a volatile RAM, such as a DRAM (Dynamic Random Access Memory) and a SRAM (Static Random Access Memory), or a nonvolatile RAM, such as a FeRAM (Ferroelectric Random Access Memory), an MRAM (Magnetoresistive Random Access Memory), a PRAM (Phase Change Random Access Memory), and a ReRAM (Resistance Random Access Memory). The RAM 15 may be embedded in the controller 14. The flash memory 16 includes one or more flash memory chips 17 and stores user data designated by the host 3 in one or more of the flash memory chips 17. The controller 14 and the flash memory 16 are connected via a flash memory interface 21 (See FIG. 4), such as Toggle and ONFI.

The host 3 includes a CPU (central processing unit) 4, a memory 5, a controller 6, and a network interface controller (NIC) 7. The CPU 4 is a central processing unit in the host 3, and performs various calculations and control operations of the host 3. The CPU 4 and the controller 6 are connected through an interface using a protocol such as PCI Express. The CPU 4 performs control of the storage device 2 via the controller 6. The controller 6 is a PCIe Switch and a PCIe expander in the present embodiment, but, a SAS expander, a RAID controller, a JBOD controller, a JBOF controller, and the like may be used as the controller 6.

The CPU 4 also performs control of the memory 5. The memory 5 is, for example, a DRAM (Dynamic Random Access Memory), a MRAM (Magnetoresistive Random Access Memory), a ReRAM (Resistance Random Access Memory), and a FeRAM (Ferroelectric Random Access Memory).

The CPU 4 is a processor configured to control the operation of the host 3. The CPU 4 executes, for example, an operating system (OS) 11 loaded from one of the storage devices 2 to the memory 5. The CPU 4 is connected to the NIC 7, which is connected to an external network via a network interface. The network interface employs a protocol, for example, an Ethernet, InfiniBand, Fibre Channel, PCI Express Fabric, WiFi, and the like.

The memory 5 temporarily stores a program and data and functions as a working memory of the CPU 4. The memory 5 includes memory regions for storing the OS 11, application software 13, a look-up table (LUT) 8, a submission queue 50, and a completion queue 51, and also includes a write buffer (WB) 54 and a read buffer (RB) 55. As is generally known, the OS 11 represents system software for managing the host 3, and may be a commodity OS such as Linux®, Windows®, or a virtualization software available from VMware, Inc. The OS 11 is executed to manage an input to and an output from the host 3, the storage devices 2, and the memory 5. That is, the OS 11 enables software to use components in the storage system 1, including the storage devices 2. Also, the OS 11 is used to control a manner of data writing to the storage devices 2 and data reading from the storage devices 2.

The write buffer 54 temporarily stores data to be written into the storage devices 2, i.e., write data. The read buffer (RB) 55 temporarily stores data read from the storage devices 2, i.e., read data. The LUT 8 is used to manage mapping between File IDs (Object IDs or logical addresses) of data and physical addresses of a flash memory 16 and the write buffer memory 54 in which the data are stored for writes or to be stored for reads. The submission queue 50 contains, for example, commands and requests with respect to the storage devices 2. The completion queue 51 contains information indicating completion of the commands and requests and information related to the completion, which were sent to the host 3 upon completion of the commands and requests by the storage devices 2.

The host 3 sends, to a storage device 2 via the corresponding interface 10, a number of commands for data writing to and data reading from the storage device 2. The commands include a read command 90, a write command 91, an invalidate command, a copy command, and the like, as described below in detail.

Figure 3:
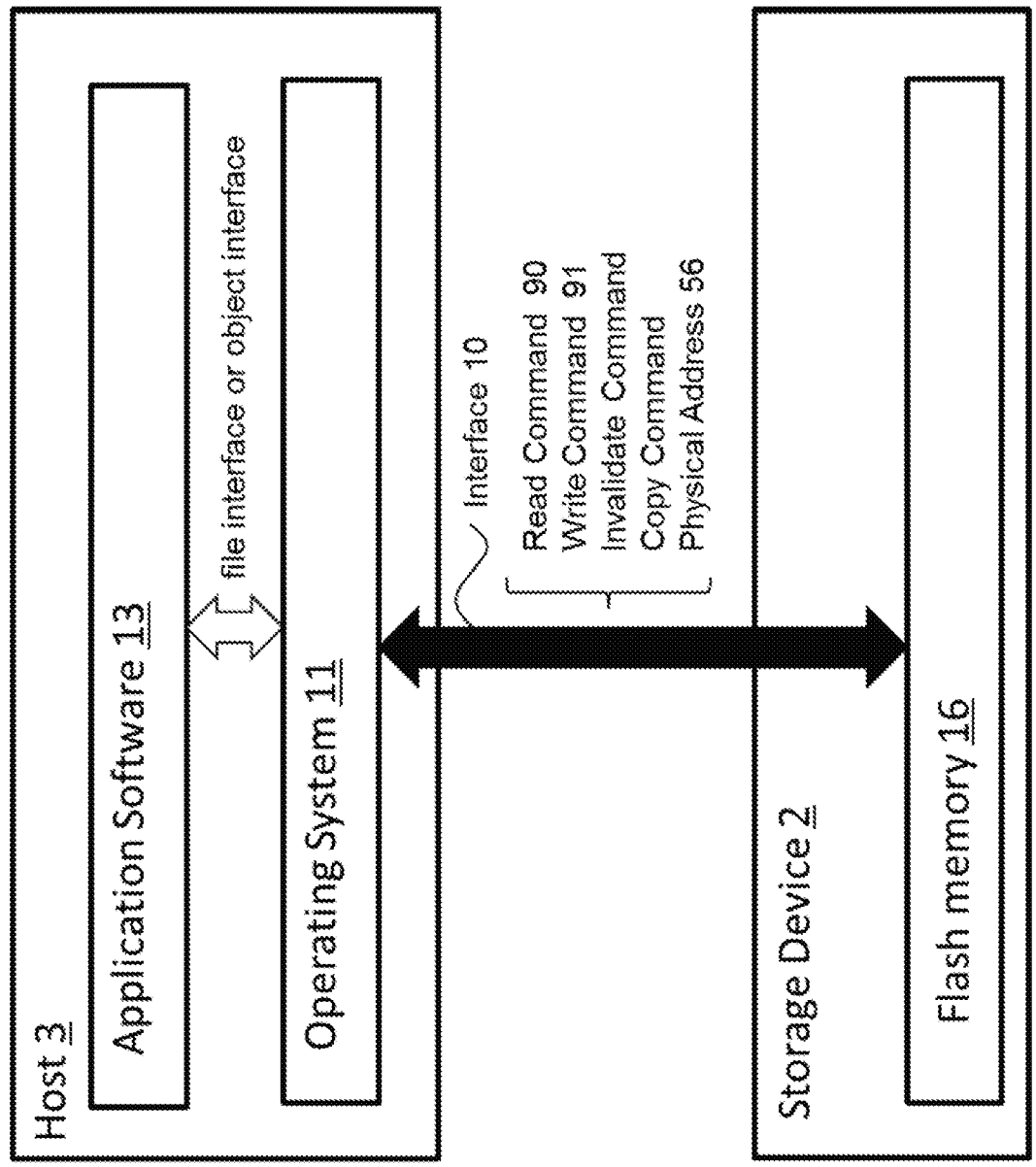
FIG. 3 illustrates a software layer structure of the host and communication architecture between the host and a storage device according to the embodiment.

In addition, one or more units of the application software 13 are loaded, respectively, in the memory 5. FIG. 3 illustrates a software layer structure of the host 3 and communication architecture between the host 3 and the storage device 2 according to the present embodiment. Usually, the application software 13 loaded in the memory 5 does not directly communicate with the storage device 2 and instead communicates with the storage device 2 through the OS 11 loaded in the memory 5 via a file interface and an object interface.

The OS 11 operates to transmit commands including the read command 90, the write command 91, the invalidate command, and the copy command, and a physical address 56, to the storage device 2 via the interface 10. The physical address 56 is used to designate a physical location of the flash memory 16 to be accessed for data reading or data writing. In accordance with these commands and the physical address, if any, the flash memory 16, more particularly the flash memory chip 17, carries out data-access processing.

The application software 13 includes, for example, client software, database software (e.g., Cassandra DB, Mongo DB, HBASE, and etc.), Distributed Storage System (Ceph etc.), Virtual Machine (VM), guest OS, and Analytics Software (e.g., Hadoop, R, and etc.).

[Flash Memory Chip]

Figure 4:
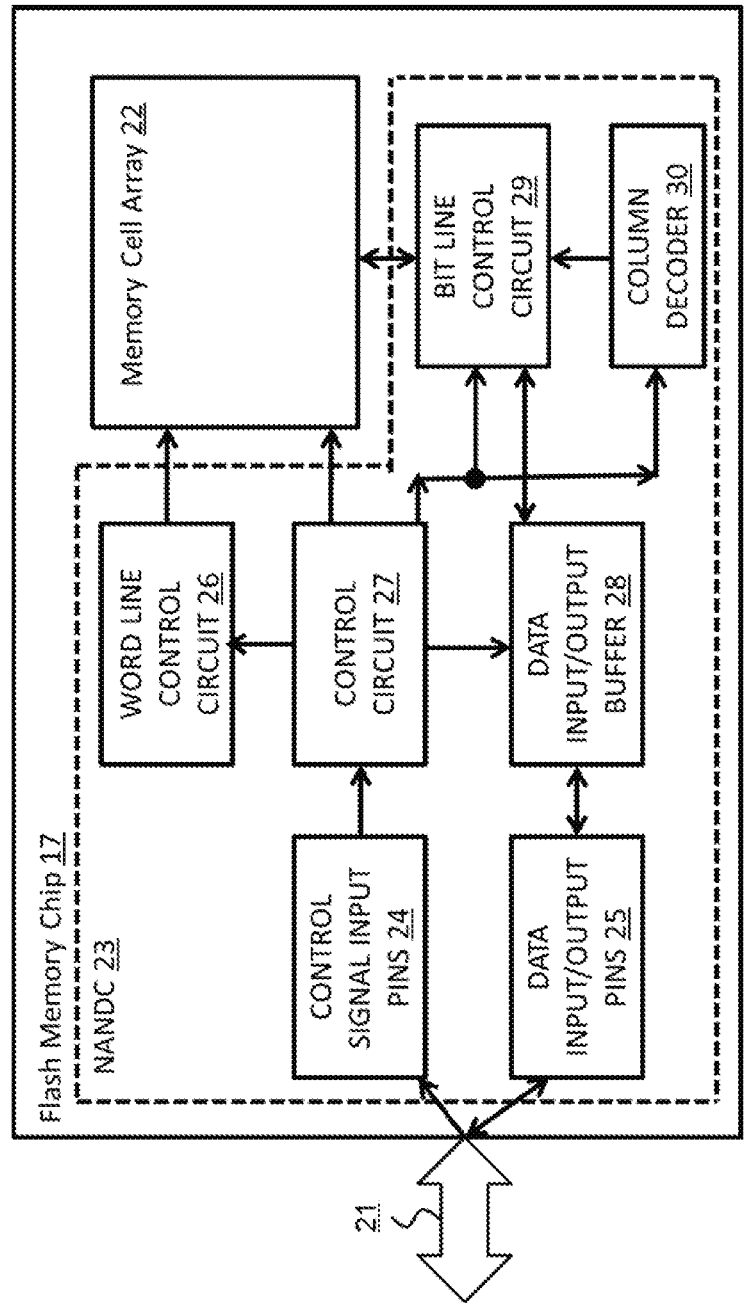
FIG. 4 illustrates a configuration of a flash memory chip in a storage device.

FIG. 4 illustrates a configuration of the flash memory chip 17. The flash memory chip 17 includes a memory cell array 22 and a NAND controller (NANDC) 23. The memory cell array 22 includes a plurality of memory cells arranged in a matrix configuration, each of which stores data, as described below in detail. The NANDC 23 is a controller configured to control access to the memory cell array 22. Specifically, the NANDC 23 includes control signal input pins 24, data input/output pins 25, a word line control circuit 26, a control circuit 27, a data input/output buffer 28, a bit line control circuit 29, and a column decoder 30. The control circuit 27 is connected to the control signal input pins 24, the word line control circuit 26, the data input/output buffer 28, the bit line control circuit 29, and the column decoder 30, and controls the entire operations of the circuit components of the NANDC 23. Also, the memory cell array 22 is connected to the word line control circuit 26 and the control circuit 27. Further, the control signal input pins 24 and the data input/output pins 25 are connected to the controller 14 of the storage device 2, through the flash interface 21.

When data are read from the flash memory chip 17, data in the memory cell array 22 are output to the bit line control circuit 29 and then temporarily stored in the data input/output buffer 28. Then, the read data are transferred to the controller 14 of the storage device 2 from the data input/output pins 25 through the flash interface 21. When data are written to the flash memory chip 17, data to be written (write data) are input to the data input/output buffer 28 through the data input/output pins 25. Then, the write data are transferred to the column decoder 30 through the control circuit 27, and input to the bit line control circuit 29 by the column decoder 30. The write data are written to memory cells of the memory cell array 22 with a timing controlled by the word line control circuit 26 and the bit line control circuit 29. When control signals are input to the flash memory chip 17 from the controller 14 of the storage device 2 through the flash interface 21, the control signals are input through the control signal input pins 24 into the control circuit 27. Then, the control circuit 27 generates control signals, according to the control signals from the controller 14, and controls voltages for controlling memory cell array 22, bit line control circuit 29, column decoder 30, data input/output buffer 28, and word line control circuit 26. Here, a circuit section that includes the circuits other than the memory cell array 22 in the flash memory chip 17 is referred to as the NANDC 23.

Figure 5:
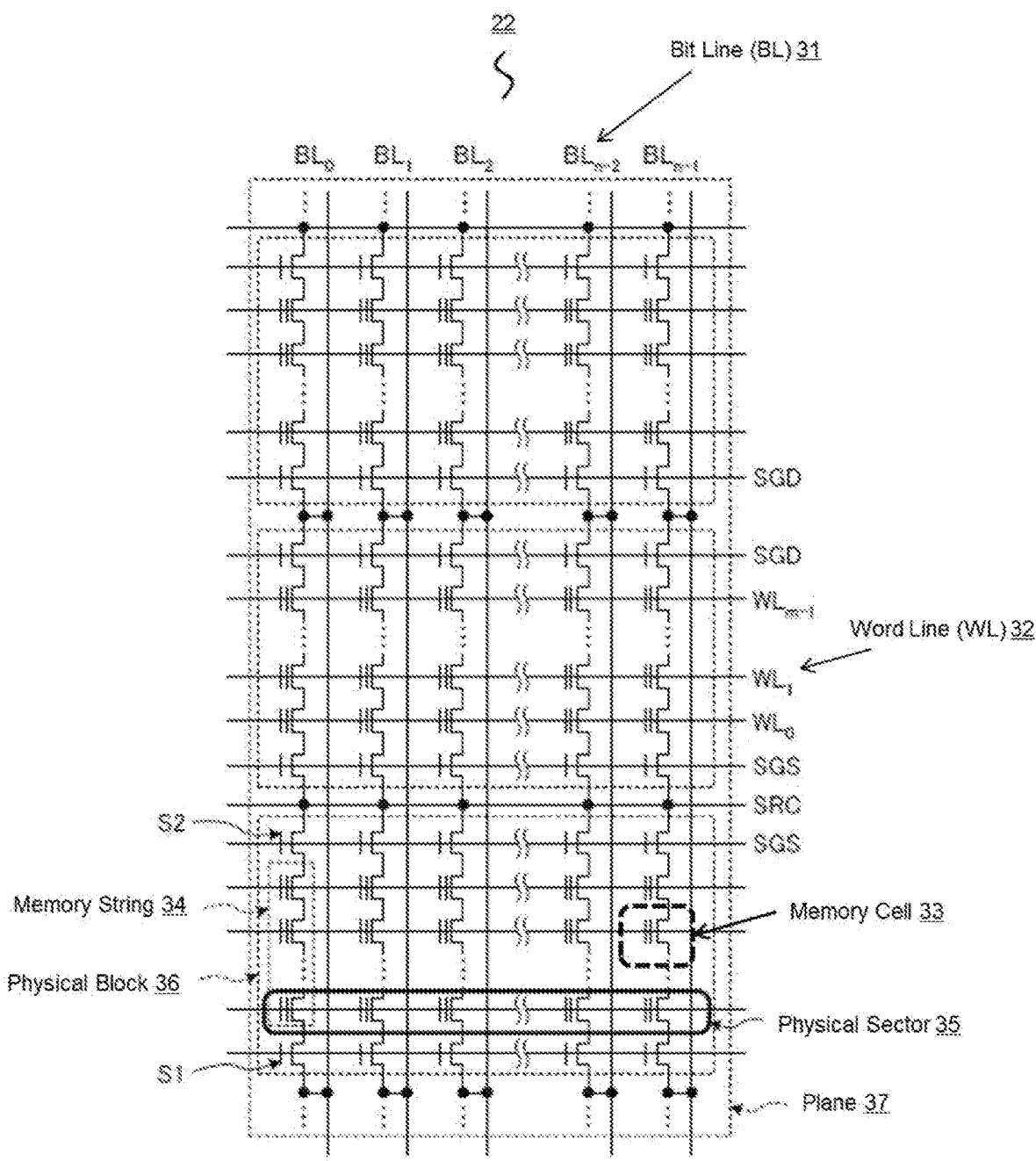
FIG. 5 illustrates a detailed circuit structure of a memory cell array in the flash memory chip.

FIG. 5 illustrates a detailed circuit structure of the memory cell array 22. The memory cell array 22 includes one or more planes 37 (only one of which is depicted in FIG. 5). Each plane 37 includes a plurality of physical blocks 36, and each physical block 36 includes a plurality of memory strings 34. Further, each of the memory strings (MSs) 34 includes a plurality of memory cells 33.

The memory cell array 22 further includes a plurality of bit lines 31, a plurality of word lines 32, and a common source line. The memory cells 33, which are electrically data-rewritable, are arranged in a matrix configuration at intersections of bit lines 31 and the word lines. The bit line control circuit 29 is connected to the bit lines 31 and the word line control circuit 26 is connected to the controlling word lines 32, so as to control data writing and reading with respect to the memory cells 33. That is, the bit line control circuit 29 reads data stored in the memory cells 33 via the bit lines 31 and applies a write control voltage to the memory cells 33 via the bit lines 31 and writes data in the memory cells 33 selected by the word line 32.

In each memory string (MS) 34, the memory cells 33 are connected in series, and selection gates S1 and S2 are connected to both ends of the MS 34. The selection gate S1 is connected to a bit line BL 31 and the selection gate S2 is connected to a source line SRC. Control gates of the memory cells 33 arranged in the same row are connected in common to one of word lines 32 WL0 to WLm−1. First selection gates S1 are connected in common to a select line SGD, and second selection gates S2 are connected in common to a select line SGS.

A plurality of memory cells 33 connected to one word line 32 configures one physical sector 35. Data are written and read for each physical sector 35. In the one physical sector 35, data equivalent to two physical pages (two pages) are stored when 2 bit/cell write system (MLC, four-level) is employed, and data equivalent to one physical page (one page) are stored when 1 bit/cell write system (SLC, two-level) is employed. Further, when 3 bit/cell write system (TLC, eight-level) is employed, data equivalent to three physical pages (three pages) are stored in the one physical sector 35. Further, data are erased in a unit of the physical block 36.

During a write operation (also referred to as a program operation), a read operation, and a program verify operation, one word line WL is selected according to a physical address, such as a row address, received from the controller 14, and, as a result, one physical sector 35 is selected. Switching of a page in the selected physical sector 35 is performed according to a physical page address in the physical address. A physical address comprises a physical block address 58 and a physical page address 59 (See FIG. 7). A physical page address is assigned to each of the physical pages, and a physical block address is assigned to each of the physical blocks 36.

Figure 6:
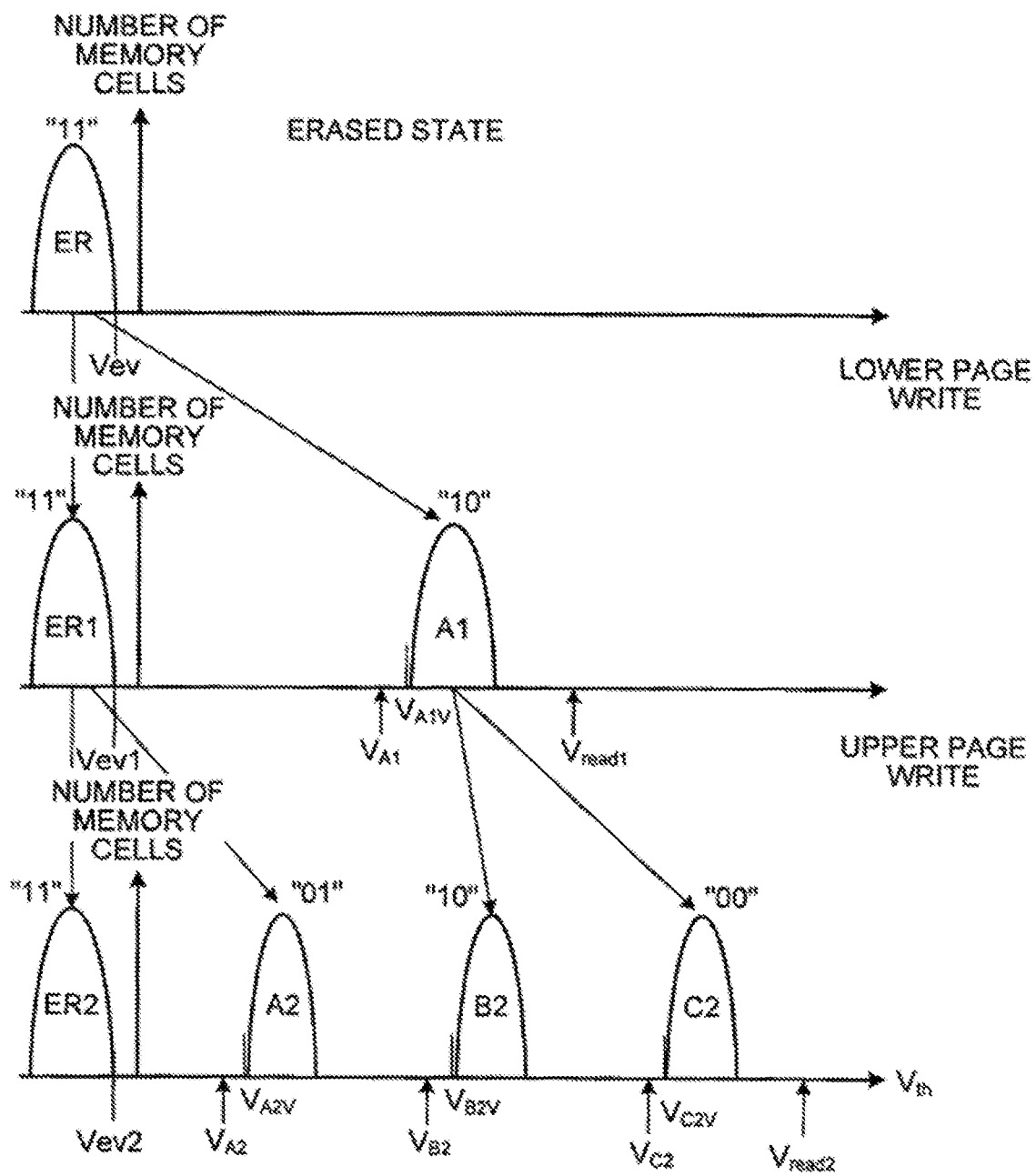
FIG. 6 illustrates a relation between 2-bit four-level data (data "11", "01", "10", and "00") stored in a memory cell of a four-level NAND cell type and a threshold voltage distribution of each level.

The four-level NAND memory of 2 bit/cell is configured such that a threshold voltage in one memory cell could have four kinds of distributions. FIG. 6 illustrates a relation between 2-bit four-level data (data "11", "01", "10", and "00") stored in a memory cell 33 of a four-level NAND cell type and a threshold voltage distribution of each level. 2-bit data of one memory cell 33 includes lower page data and upper page data. The lower page data and the upper page data are written in the memory cell 33 according to separate write operations, i.e., two write operations. Here, when data are represented as "XY," "X" represents the upper page data and "Y" represents the lower page data.

Each of the memory cells 33 includes a memory cell transistor, for example, a MOSFET (Metal Oxide Semiconductor Field Effect Transistor) having a stacked gate structure formed on a semiconductor substrate. The stacked gate structure includes a charge storage layer (a floating gate electrode) formed on the semiconductor substrate via a gate insulating film and a control gate electrode formed on the floating gate electrode via an inter-gate insulating film. A threshold voltage of the memory cell transistor changes according to the number of electrons accumulated in the floating gate electrode. The memory cell transistor stores data by varying the threshold voltage thereof.

In the present embodiment, each of the memory cells 33 employs a write system of a four-level store method for 2 bit/cell (MLC), using an upper page and a lower page. Alternatively, the memory cells 33 may employ a write system of a two-level store method of 1 bit/cell (SLC), using a single page, an eight-level store method for 3 bit/cell (TLC), using an upper page, a middle page, and a lower page, or a multi-level store method for 4 bit/cell (QLC) or more, or mixture of them. The memory cell transistor is not limited to the structure including the floating gate electrode and may be a structure such as a MONOS (Metal-Oxide-Nitride-Oxide-Silicon) type that can adjust a threshold voltage by trapping electrons on a nitride interface functioning as a charge storage layer. Similarly, the memory cell transistor of the MONOS type can be configured to store data of one bit or can be configured to store data of a multiple bits.

The memory cell transistor can be, as a nonvolatile storage medium, a semiconductor storage medium in which memory cells are three-dimensionally arranged as described in U.S. Pat. No. 8,189,391, U.S. Patent Application Publication No. 2010/0207195, and U.S. Patent Application Publication No. 2010/0254191, the entire contents of both applications are incorporated by reference herein.

[Address Structure]

Figure 7:
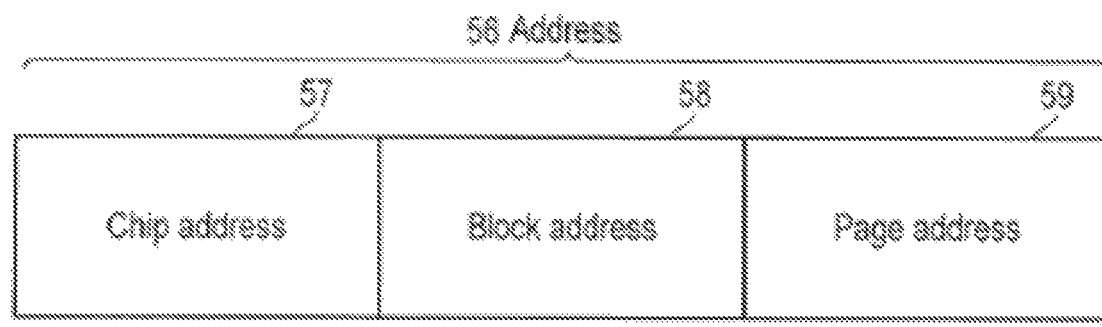
FIG. 7 illustrates an example of an address structure of a physical address according to the embodiment.

FIG. 7 illustrates an example of an address structure of the physical address 56 according to the present embodiment. The physical address 56 is transmitted via the interface 10 as a form of the address structure shown in FIG. 7, when the OS 11 operates according to the procedure of the physical access. The address structure of the physical address 56 includes a chip address 57, a block address 58, and a page address 59. In the present embodiment, the chip address 57 is located at the MSB (most significant bit) side of the address structure, and the page address 59 is located at the LSB (least significant bit) side of the address structure as shown in FIG. 7. However, the locations of the chip address 57, the block address 58, and the page address 59 in the physical address 56 can be determined arbitrarily.

[Block Mapping]

Figure 8:
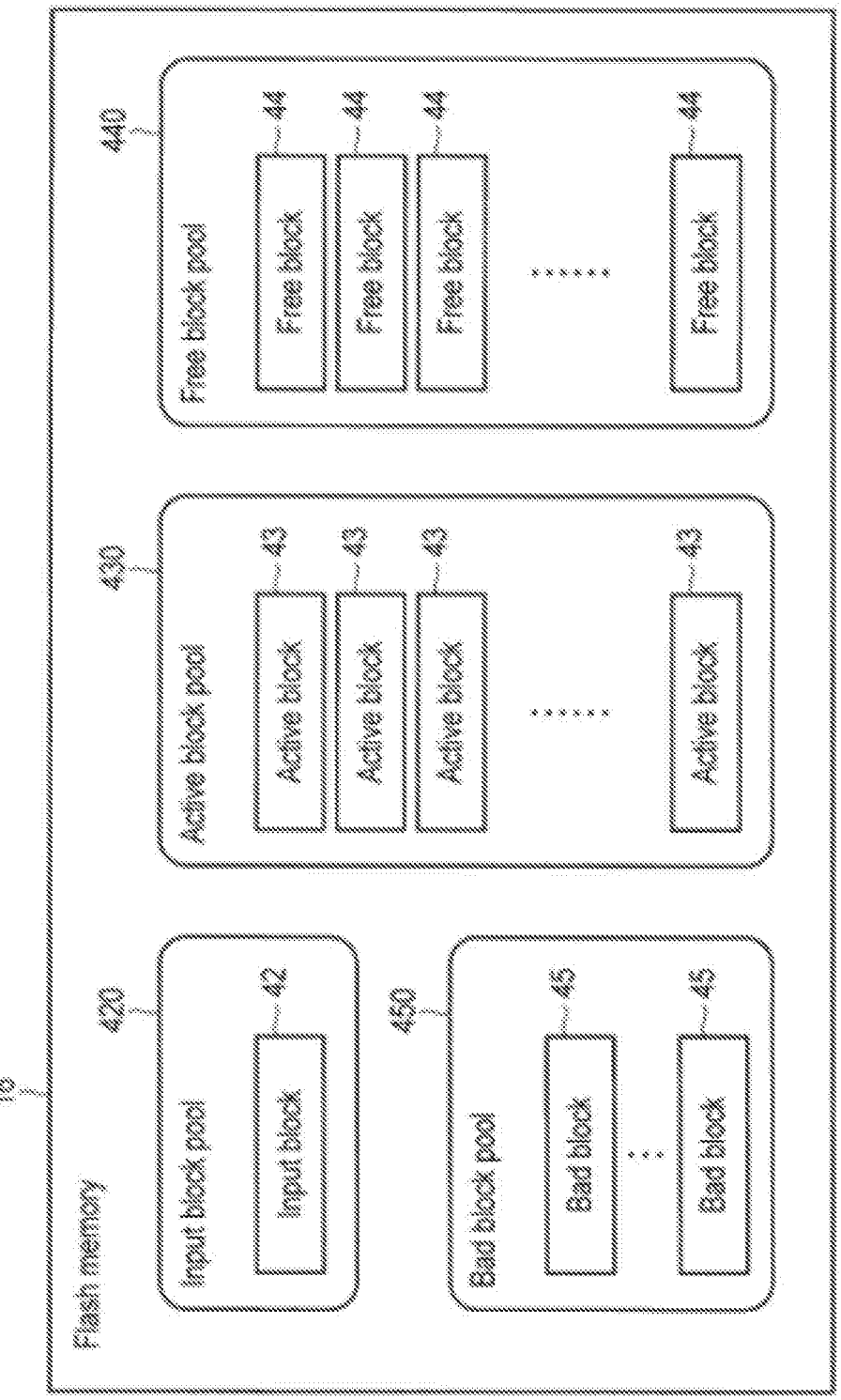
FIG. 8 illustrates an overview of mapping of physical blocks based on block pools in the embodiment.

FIG. 8 illustrates an overview of the mapping of physical blocks based on block pools in the present embodiment. As described above, the mapping is managed using the BMT 46 stored in the RAM 15. The block pools include an input block pool 420, an active block pool 430, a free block pool 440, and a bad block pool 450. The mappings of physical blocks are managed by the controller 14 of the storage device 2, and when a physical block is remapped into a different block pool, the controller 14 updates the mappings in the BMT 46. The controller 14 maps each of the physical blocks of the flash memory 16 to one of the block pools, in the BMT 46.

The input block pool 420 includes at least one input block 42. The input block 42 is a block in which data are written. The input block 42 may store no data, or include both a written region and an unwritten region in which data can be written.

The active block pool 430 may include one or more active blocks 43. The active block 43 is a physical block that no longer has a writable region (i.e., becomes full of data). Also, at least some of the written data in the active block 43 are valid data.

The free block pool 440 includes one or more free blocks 44. The free block 44 includes physical blocks that have not stored any data previously and physical blocks that store no valid data. That is, all data stored in the free block 44, if any, have been invalidated.

The bad block pool 450 includes one or more bad blocks 45. The bad block 45 is a block that cannot be used for data writing, for example, because of defects.

Figure 9:
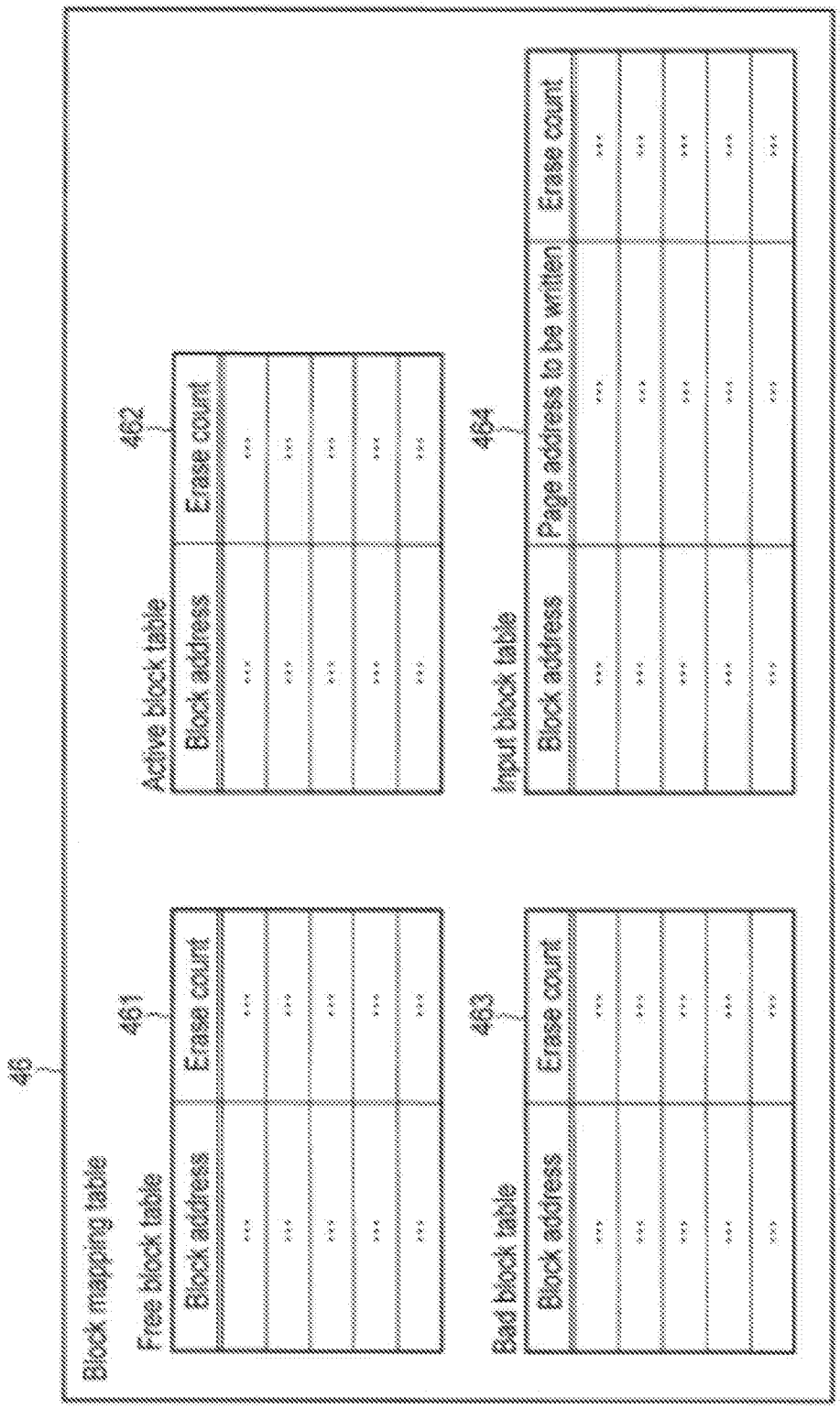
FIG. 9 illustrates an example of a block mapping table (BMT) according to the embodiment.

FIG. 9 illustrates an example of the block mapping table (BMT) 46 employed in the storage device 2 according to the present embodiment. The BMT 46 includes a free block table 461, an active block table 462, a bad block table 463, and an input block table 464. In each of the tables 461-464 of the BMT 46, each entry indicates correspondence between a block address and an erase count, which indicates a number of times data in the block address have been erased. Other configurations of different types of block pools may be also managed in the BMT 46.

The input block table 464 also indicates a physical page address (PPA) in which next write data are to be written. When the controller 14 remaps a free block 44 in the free block pool 440 as an input block 42, the controller 14 removes a block address of the free block 44 from the free block table 461, and adds a new entry including the block address and PPA=0 to the input block table 464.

Because bad blocks 45 of the flash memory 16 are managed by the controller 14 using the bad block table 463 of the BMT 46 in the present embodiment, the CPU 4 of the host 3 does not have to manage the bad blocks 45 and does not have to monitor unreliable physical blocks and defects of the flash memory 16. If a physical block is determined to be unreliable by the controller 14 of the storage device 2, the controller 14 prevent data from being written into the physical block by deleting an entry of the corresponding block address from one of the input block table 464, the active block table 462, and the free block table 461 that includes the entry and by adding the entry to the bad block table 463. For example, when a program error, an erase error, or an uncorrectable ECC error happens during access to a physical block, the controller 14 determines to remap the physical block as a bad block 45. In the present embodiment, a physical address in which data are to be written may be determined either by the host 2 or determined by the controller 14. When the physical address is determined by the controller 14, the host 3 does not need to perform such bad block management.

In addition, because an erase count of each physical block is managed by the controller 14 of the storage device 2 using the BMT 46, the controller 14 may carry out dynamic wear leveling when writing data into the flash memory 16. For example, in the present embodiment, when the controller 14 remaps a free block 44 in the free block pool 440 as an input block 42, the controller 14 selects a free block 44 that has the least erase count. If the free block 44 is located in a channel or a bank that is in a busy state, the controller 14 may select another free block 44 that has the second least erase count and is in an idle state from the free block pool 440.

When the controller 14 processes a write operation with respect to the input block 42, the controller 14 specifies the physical page address (PPA) by referring to the input block table 464, writes data into the physical page address of the input block 42, and increments the PPA in the input block table 464 ((New) PPA=(old) PPA+written data size). When the (new) PPA exceeds maximum page address of the input block 42, the controller 14 remaps the input block 42 as an active block 43 in the active block pool 430.

[Write Operation]

Figure 10:
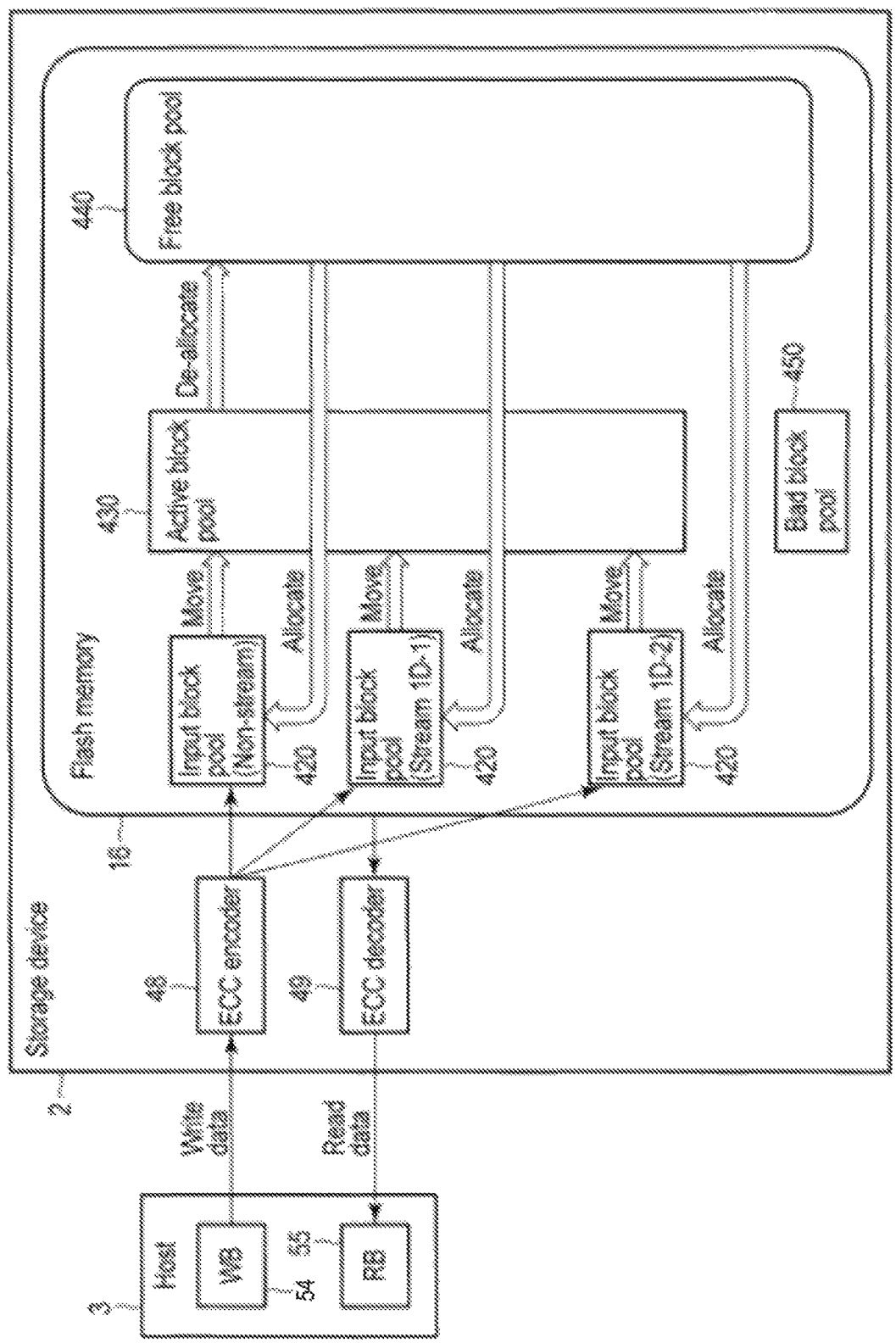
FIG. 10 illustrates an architecture overview of data flow and a block mapping transition in the storage system according to the embodiment.

FIG. 10 schematically illustrates an example of a write operation performed in the storage device 2 according to the present embodiment. During the write operation, the controller 14 writes write data (user data) stored in the write buffer 54 into the flash memory 16. Each of the input block pool 420, the active block pool 430, the free block pool 440, and the bad block pool 450 in FIG. 10 includes one or more physical blocks.

The controller 14 receives the write data from the write buffer 54 via the interface 10 and generates an ECC code from the write data using an ECC encoder 48 of the controller 14. Also, the controller 14 decodes read data, which include the user data and the ECC code, using an ECC decoder 49 in the controller 14 during a read operation described below.

When the controller 14 writes the write data from the write buffer 54 into the flash memory 16, the controller 14 specifies physical addresses of pages in the input block 42 of the input block pool 420 into which the write data are to be written by referring to the BMT 46. If there is no available input block 42 in the flash memory 16, the controller 14 allocates a new input block 42 by remapping a free block 44 in the free block pool 440.

In addition, if no physical page in the input block 42 is available for data writing without erasing data therein, i.e., becomes full of written data, the controller 14 remaps the block as an active block 43 in the active block pool 430. The controller 14 may also remap (de-allocate) an active block 43 in the active block pool 430 as a free block 44 in the free block pool 440.

A plurality of input blocks 42 is prepared in a plurality of input blocks 420, each of which is dedicated for data writing with respect to a corresponding stream ID, and write data associated with a stream ID is written into an input block 42 associated with the stream ID. A write command from the host 3 includes the stream ID in this example. When the host 3 operates to post the write command specifying a stream ID to the submission queue 50, the controller 14 receives the write data from the write buffer 54 and writes the write data into the input block 42 associated with the stream ID. If the host 3 operates to post a write command which does not specify a stream ID to the submission queue 50, the controller 14 receives the write data from the write buffer 54 and writes the write data into an input block 42 associated with no stream ID. By storing write data into different input blocks 42 in accordance with the stream ID, the type of data (or lifetime of data) stored in each input block 42 can be made more uniform, and as a result, entire data in a physical block may be deleted without having to partially transfer the data to another physical block when garbage collection operation is performed, i.e., garbage collection operation becomes more efficient.

Figure 11:
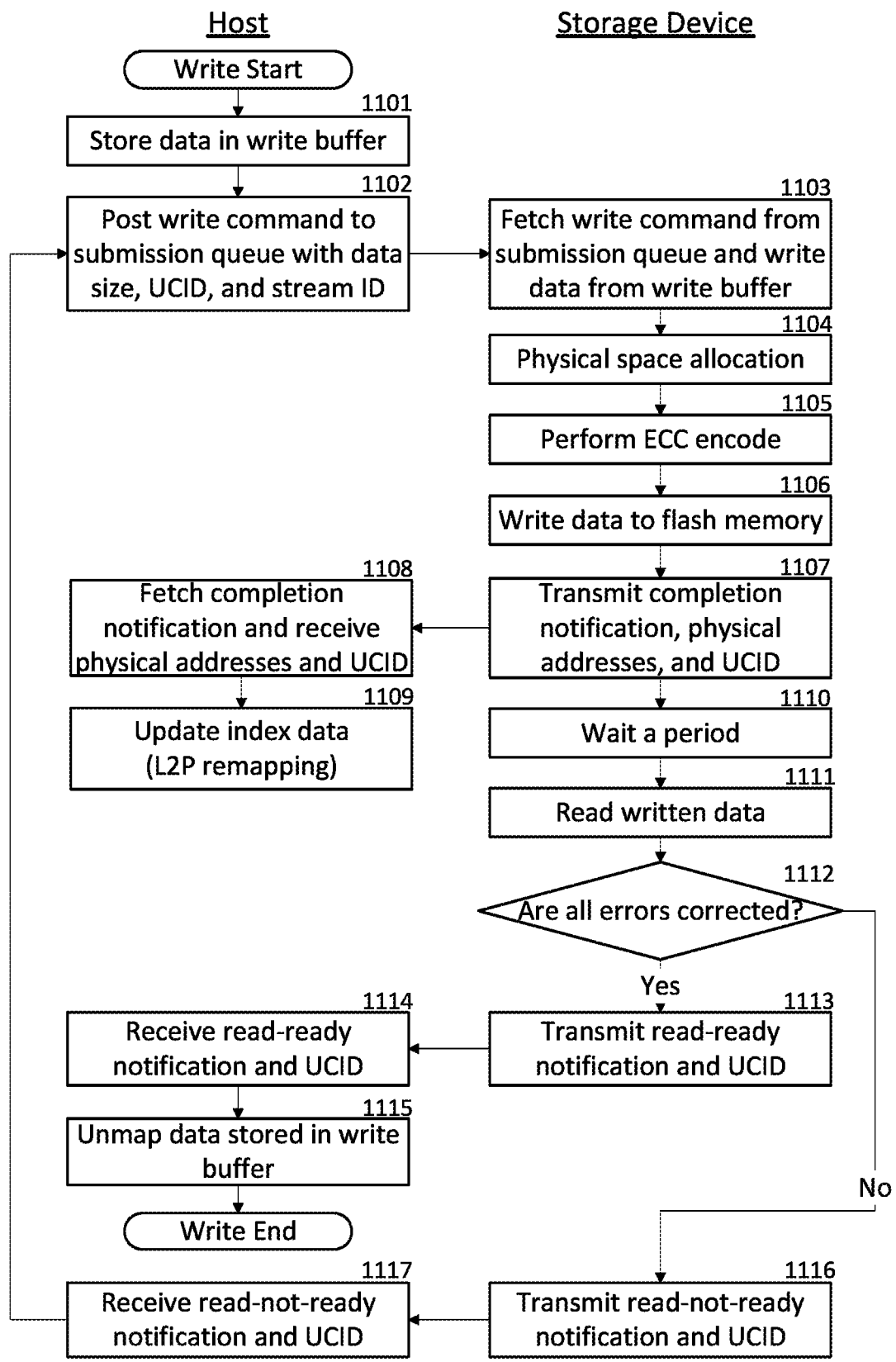
FIG. 11 illustrates a flow of a write operation carried out according to an embodiment.

FIG. 11 illustrates a flow chart of a write operation in which the storage device 2 determines the physical address of the memory cell array 22 at which write data are to be written and the host 3 makes no designation of the physical address. When the write operation starts, in step 1101, the host 3 writes data, which are to be written into the flash memory 16 of the storage device 2 (hereinafter referred to as "write data"), into the write buffer (WB) 54 of the host 3. Also, the host 3 updates the LUT 8 stored in the memory 5 of the host 3, so that mapping between File ID (Object ID or logical address) of the write data and an address of the WB 54 are stored therein. Then, in step 1102, the host 3 posts a write command, which includes size information of the write data but includes no address information to the submission queue 50 of the host 3. The write command also includes a Unique Command Identifier (UCID) and a stream ID.

In step 1103, the controller 14 of the storage device 2 fetches the write command from the submission queue 50 and the write data from the WB 54. Upon reception of the write data, in step 1104, the controller 14 determines a physical location (physical address 56) of the flash memory 16 at which the write data are to be written, referring to the BMT 46. Specifically, the controller 14 determines a next available page of an input block 42 corresponding to the stream ID as the physical location. Then, in step 1105, the ECC encoder 48 (See FIG. 10) of the controller 14 generates an ECC code from the write data. In step 1106, the controller 14 issues a write command to the flash memory 16 to write the write data and the ECC code in the determined physical location of the flash memory 16.

Upon issuing the command to write the write data in the determined physical location of the flash memory 16 (i.e., the input block 42), when no program error (write error) is returned from the flash memory 16, in step 1107, the controller 14 transmits a write completion notification, which includes the physical address 56 at which the write data were written and the UCID, to the host 3, so that the write completion notification is posted on the completion queue 51 of the host 3. In step 1108, the host 3 fetches the write completion notification from the completion queue 51. Then, in step 1109, the host 3 updates the LUT 8 stored in the memory 5 of the host 3, so that mapping between File ID (Object ID or logical address) of the write data, for which the write command were posted along with the UCID, and the physical address 56 of the input block 42 returned along with the same UCID are stored therein.

After transmitting the write completion notification in step 1107, the controller 14 counts a predetermined period of time in step 1110. When the predetermined period of time has passed, the process proceeds to the next step 1111. Here, the predetermined period of time is an amount of time that is deemed to be sufficient for the flash memory 16 to be ready for reading the write data. In general, it takes a certain amount of time (e.g., 100-1000 msec) until the flash memory 16 becomes ready for reading the write data after the write data were written in the flash memory 16. This is because electrons in the floating gate electrodes of the memory cells may not be in a stable state yet and the threshold voltages of such memory cell may be still at values indicating different data (e.g., "10" instead of "00," "01" instead of "10" in FIG. 6), even if no program error is returned. Further, this predetermined period of time may be set to be larger as the number of bits stored in each memory cell becomes large, because preciseness of the threshold values becomes more critical. For example, the predetermined period of time for writing in TLC-type memory cells is larger than the predetermined period of time for writing in MLC-type memory cells.

After the predetermined period of time has passed, the controller 14 reads data (the write data and the ECC code) from the flash memory 16 in step 1111. Specifically, the ECC decoder 49 (See FIG. 10) of the controller 14 decodes the data read from the flash memory and carries out error correction of the write data using the ECC code as necessary. Then, in step 1112, the controller 14 determines whether any error or errors in the read data are corrected. If the determination is positive (Yes in step 1112) the process proceeds to step 1113, and if not (No in step 1112) the process proceeds to step 1116.

In step 1113, the controller 14 transmits a notification (read-ready notification) to the host 3 along with the UCID included in the write command. In step 1114, the host 3 receives the read-ready notification, and as a result the host 3 recognizes that the flash memory 16 is now ready for reading the write data. Here, since the read-ready notification includes the UCID, the host 3 can recognize which write data or which write command corresponds to the read-ready notification. Upon fetching of the read-ready notification, in step 1115, the host 3 remaps the LUT 8, so that the address of the WB 54 is unmapped from the File ID (Object ID or logical address) of the write data, i.e., the write data are trimmed (invalidated) in the WB 54. Alternatively, the host 3 may erase the write data buffered in the WB 54. Through these processes, the write operation ends.

On the other hand, if the determination in step 1112 is negative (No in step 1112), i.e., all errors in the read data could not be corrected, in step 1116, the controller 14 transmits a notification (read-not-ready notification), which is distinguishable from the read-ready notification, to the host 3 along with the UCID. In step 1117, the host 3 receives the read-not-ready notification, and as a result the host 3 recognizes that the flash memory 16 is not ready for reading the write data. To ensure that the write data are written in the flash memory 16 in a readable manner, the process goes back to step 1102, and the host 3 carries out step 1102 and the following steps again, using the write data stored in the WB 54.

In the above embodiment, during the second or following operations (write attempts) of steps 1102 and thereafter, the data are written in another physical location of the flash memory 16, because the unreadable (uncorrectable) data are already written in the physical location of the flash memory 16 accessed during the first operation (first attempt). Also, in the above embodiment, the predetermined period counted in step 1110 during the second or following operations may be increased by a predetermined amount (one time or repeatedly), so that sufficient time to cause the flash memory 16 ready for reading the write data can pass. In the alternative, the same predetermined period of time as the first write attempt may be counted.

Further, in the above embodiment, if an application software 13 (See FIGS. 1 and 3) issues a read request of the write data before the host 3 receives the read-ready notification, the host 3 (CPU 4) reads the write data from the WB 54 and returns the write data to the application software 13. Since the write data are stored in the WB 54 until the flash memory 16 becomes ready for reading the write data, it is possible to prevent the data from being inaccessible during the write operation.

Also, in the above embodiment, the controller 14 of the storage device 2 may be configured to return a warning when the controller 14 receives a read command 90 for the write data before transmitting the read-ready notification. Although the host 3 should be designed so as to not to issue a read command 90 for the write data before receiving the read-ready notification, improper designs of the host 3 may cause this. According to this configuration, even if such a read command 90 is received from the host 3, reading operations that would result in unsuccessful reading are not carried out.

Moreover, in another embodiment, steps 1111 and 1112 may not be carried out, and the controller 14 of the storage device 2 may transmit the read-ready notification upon passing of the predetermined period of time in step 1111. In that case, steps 1116 and 1117 are also not carried out, and no repetitive operations of step 1112 and the following steps are carried out.

In another embodiment, the process may go back to step 1110 if the determination result in step 1112 is negative, i.e., the errors included in the write data are not corrected. In this case, the same write data are repeatedly read until the write data can be read or errors in the write data can be successfully corrected.

In another embodiment, the write operation is carried out in a manner in which the host 3, instead of the controller 14 of the storage device 2, determines the physical address of the memory cell array 22 into which the write data are to be written. In this case, in step 1102, the host 3 posts the determined physical address to the submission queue 50 along with the write command, the size information, the UCID, and the stream ID. Also, since the controller 14 does not determine the physical address, step 1104 can be omitted. Furthermore, as the host 3 already recognizes the physical address in which the write data are written, the write completion notification sent from the storage device 2 does not need to contain the physical address.

As the foregoing illustrates, according to the above embodiments, the controller 14 of the storage device 2 transmits a secondary notification, such as the read-ready notification and the read-not-ready notification, to the host 3 after transmitting the write completion notification to the host 3. According to this configuration, the host 3 can recognize whether or not the write data were written in the flash memory 16 and attained a state of being successfully read, based on the write completion notification. Further, the host 3 can recognize whether or not the flash memory 16 in which write data were written is ready for reading the write data based on the secondary notification. That is, the host 3 can separately manage the timing when the write data were written in the flash memory 16 and the timing when the flash memory 16 becomes ready for reading the write data. Also, since the write data are saved in the write buffer 54 until the read-ready notification is received, the host 3 can more reliably handle the write data and prevent the write data from being lost or unreadable from the flash memory 16 after the write operation.

In addition, according to the above embodiment, as no additional operations (e.g., read-after-write operation) different from the write operation are needed to make sure that the write data were written in the flash memory in a readable manner, it is possible to suppress increase in data traffic between the host 3 and the storage device 2 and increase in latency of the storage device 2 caused by such addition operations.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
   a nonvolatile memory;
   a communication interface connectable to a host; and
   a controller configured to
      upon receipt of data to be written and a write command associated with the data and including an identifier from the host through the communication interface, carry out writing of the data at a physical location of the nonvolatile memory,
      control the communication interface to return to the host a first notification including the identifier that is included in the received write command upon determining that the writing of data at the physical location of the nonvolatile memory has completed but before verification of the written data has been carried out, and
      control the communication interface to return to the host a second notification indicating that the written data are ready for reading and including the identifier that is included in the received write command, after a predetermined period of time has passed after the first notification has been returned and the verification of the written data has been carried out.

2. The storage device according to claim 1, wherein the controller is further configured to carry out the verification by executing reading of the data written in the physical location of the nonvolatile memory and an error correction of the read data the predetermined period of time after the first notification has been returned, and determine whether all errors included in the read data, if any, are corrected, and the controller controls the communication interface to return the second notification upon determining that all errors, if any, are corrected.

3. The storage device according to claim 2, wherein the controller is further configured to control the communication interface to return a third notification upon determining that all errors included in the read data are not corrected.

4. The storage device according to claim 1, wherein the controller is further configured to determine the physical location of the nonvolatile memory at which the data are to be written when the write command is received through the communication interface, and the first notification includes the physical location, and the second notification does not include the physical location.

5. The storage device according to claim 1, wherein the write command includes the physical location, and neither the first notification nor the second notification includes the physical location.

6. The storage device according to claim 1, wherein the controller is further configured to return a fourth notification without reading the data when a read command of the data is received through the communication interface before the second notification is returned.

7. A storage system comprising:
a storage device including a nonvolatile memory, a communication interface, and a controller; and
a host connected to the communication interface of the storage device,
the controller is configured to
    upon receipt of data to be written and a write command associated with the data and including an identifier from the host through the communication interface, carry out writing of the data at a physical location of the nonvolatile memory,
    control the communication interface to return to the host a first notification including the identifier that is included in the received write command upon determining that the writing of data at the physical location of the nonvolatile memory has completed but before verification of the written data has been carried out, and
    control the communication interface to return to the host a second notification indicating that the written data are ready for reading and including the identifier that is included in the received write command, after a predetermined period of time has passed after the first notification has been returned and the verification of the written data has been carried out.

8. The storage system according to claim 7, wherein the controller is further configured to carry out the verification by executing reading of the data written in the physical location of the nonvolatile memory and an error correction of the read data the predetermined period of time after the first notification has been returned, and determine whether all errors are included in the read data, if any, are corrected, and the controller controls the communication interface to return the second notification to the host upon determining that all errors, if any, are corrected.

9. The storage system according to claim 8, wherein the controller is further configured to control the communication interface to return a third notification to the host upon determining that all errors included in the read data are not corrected.

10. The storage system according to claim 8, wherein the host includes a write buffer memory and a processor, and the processor is configured to
    temporarily store data in the write buffer memory,
    store, in a memory of the host, mapping between an identifier or a logical address for the data and the physical location of the nonvolatile memory at which the data were written, when the first notification is returned from the storage device, and
    erase or trim the data stored in the write buffer memory when the second notification is returned from the storage device after the first notification.

11. The storage system according to claim 10, wherein the processor is further configured to transmit a secondary write command associated with the data to the storage device through the communication interface when the third notification is returned from the storage device after the first notification.

12. The storage system according to claim 10, wherein the processor is further configured to read the data from the write buffer memory without transmitting a read command for the data to the storage device and return the read data, when a read request for the data is received after the first notification and before the second notification.

13. The storage system according to claim 7, wherein the controller is further configured to determine the physical location of the nonvolatile memory at which the data are to be written when the write command is received through the communication interface from the host, and the first notification includes the physical location, and the second notification does not include the physical location.

14. The storage system according to claim 7, wherein the host is configured to determine the physical location of the nonvolatile memory in which the data are to be written, and transmit the physical location along with the write command, and neither the first notification nor the second notification includes the physical location.

15. The storage system according to claim 7, wherein the controller is further configured to return a fourth notification to the host without reading the data from the nonvolatile memory when a read command of the data is received through the communication interface before the second notification is returned.

16. A computing device connectable to a nonvolatile storage device, comprising:
a memory unit;
a controller communicable with the nonvolatile storage device through a communication interface of the nonvolatile storage device; and
a processor configured to
    temporarily store data in the memory unit,
    control the controller to transmit a write command associated with the data and including an identifier to the nonvolatile storage device through the communication interface, the write command not including address information,
    store, in the memory unit, a mapping between an identifying information or a logical address for the data and a physical location of the nonvolatile memory at which the data were written, upon receipt of a first notification including the identifier that is included in the transmitted write command and indicating completion of writing the data from the nonvolatile storage device through the communication interface, and erase or trim the data stored in the memory unit upon receipt of a second notification including the identifier that is included in the transmitted write command and indicating that the data stored at the physical location of the nonvolatile memory are ready to be read from the storage device through the communication interface after the first notification has been received.

17. The computing device according to claim 16, wherein the processor is further configured to transmit a secondary write command associated with the data to the nonvolatile storage device through the communication interface thereof when a third notification indicating that the data are not ready to be read is returned from the nonvolatile storage device after the first notification.

18. The computing device according to claim 16, wherein the processor is further configured to read the data from the memory unit without transmitting a read command for the data to the storage device and return the read data, when a read request for the data is received after the first notification and before the second notification.

* * * * *